United States Patent [19]
Huang

[11] Patent Number: 5,510,728
[45] Date of Patent: Apr. 23, 1996

[54] MULTI-FINGER INPUT BUFFER WITH TRANSISTOR GATES CAPACITIVELY COUPLED TO GROUND

[75] Inventor: Tiao-Yuan Huang, Cupertino, Calif.

[73] Assignee: VLSI Technology, Inc., San Jose, Calif.

[21] Appl. No.: 502,464

[22] Filed: Jul. 13, 1995

Related U.S. Application Data

[63] Continuation of Ser. No. 275,185, Jul. 14, 1994, abandoned.

[51] Int. Cl.[6] ........................ H03K 19/0948; H02H 9/04
[52] U.S. Cl. ............................... 326/30; 361/91; 361/111; 257/357; 257/361
[58] Field of Search ................................ 361/56, 91, 111, 361/118; 257/355, 357, 360, 361, 362; 326/21, 30

[56] References Cited

U.S. PATENT DOCUMENTS

| | | | |
|---|---|---|---|
| 4,551,779 | 11/1985 | Murakami et al. | 257/360 |
| 4,750,078 | 6/1988 | Ganger et al. | 361/56 |
| 4,775,809 | 10/1988 | Watanabe | 326/121 |
| 4,924,119 | 5/1990 | Lee | 326/50 |
| 4,989,057 | 1/1991 | Lu | 257/357 |
| 5,027,174 | 6/1991 | Mimoto | 361/56 |
| 5,041,889 | 8/1991 | Kriedt et al. | 257/362 |
| 5,272,586 | 12/1993 | Yen | 257/360 |

*Primary Examiner*—Edward P. Westin
*Assistant Examiner*—Benjamin D. Driscoll
*Attorney, Agent, or Firm*—Clifton L. Anderson

[57] ABSTRACT

An input buffer for a CMOS integrated circuit comprises parallel pairs of complementary PMOS pull-up and NMOS pull-down transistors. Floating NMOS gates are capacitively coupled to $V_{SS}$ by a first-level metalization pattern. The metal-to-gate overlap capacitance and the gate-to-drain overlap capacitance define a voltage divider that leaves the gate at a small positive voltage during an electrostatic discharge event. This ensures that all NMOS transistors of a buffer enter a conducting bipolar mode before any of them enters second breakdown. This arrangement maximizes input-buffer protection from electrostatic discharge events. The novel NMOS arrangement is readily compatible with gate array designs.

3 Claims, 4 Drawing Sheets

MULTI-FINGER INPUT BUFFER WITH TRANSISTOR GATES CAPACITIVELY COUPLED TO GROUND

This is a continuing application of U.S. patent application Ser. No. 08/275,185, filed Jul. 14, 1994, now abandoned.

BACKGROUND OF THE INVENTION

The present invention relates to integrated circuits and, more particularly, to input structures for CMOS integrated circuits. A major objective of the present invention is to provide for gate-array integrated circuits with enhanced tolerance of electrostatic discharge (ESD).

Much of modern progress is associated with the increasing circuit density and speed of integrated circuits. CMOS (Complementary Metal-Oxide-Silicon) technology has provided integrated circuits with relatively low power requirements and, concomitantly, relatively low power dissipation. The low power dissipation minimizes damaging heat buildup, while low power requirements are attractive for portable applications and, more generally, for energy conservation.

In terms of both time and money, while the marginal per integrated circuit costs can be quite low (with reasonable manufacturing yields), the start up costs can be quite substantial. Thus, while integrated circuits can be very economical when produced in large quantities, low volume runs can be prohibitively expensive. Low volume runs are important, not only for certain specialized applications, but as intermediate steps in the development of integrated circuits eventually destined for large volume production.

An important sub-industry has emerged to provide for relatively low-cost, easy-to-design, "custom" integrated circuits. These custom circuits are widely referred to as "application-specific integrated circuits" or "ASICs". One of the earlier and still one of the most widely used type of ASIC is the CMOS gate array. A gate array "blank" is an integrated circuit "precursor" in which the circuit elements, e.g., transistors, are predefined, but most of the interconnections between circuit elements are not defined. Customization for specific applications is achieved by forming the interconnects.

Since several different integrated circuit designs can be based on the same gate-array blank design, the circuits can take advantage of the savings involved in the relatively high volume production of the blank. In addition, even the customization can take advantage of economies of scale, since the different custom designs require only different contact and metalization masks. Thus, gate arrays provide much of the cost savings associated with large volume runs to small volume ASIC runs.

One of the problems that CMOS gate arrays share with other integrated circuits, in particular, other CMOS integrated circuits, is vulnerability to ESD. While circuit design can comfortably limit the internal voltages of an integrated circuit design, there is little control over the voltages that can be applied to the inputs and outputs of the integrated circuit itself. Electric charges can build up in a number of situations; accumulated charges (static electricity) suddenly discharged across the pins of an integrated circuit can destroy the circuit. Those skilled in the art are aware of precautions that must be taken in system design and integrated circuit handling to minimize the occurrence of ESD. Nevertheless, ESD can and does occur. Therefore, it is highly desirable to reduce the vulnerability of the integrated circuits themselves to ESD.

Accordingly, it is general practice to include specific input/output structures, not only to buffer incoming and outgoing signals, but also to protect the circuit against ESD. Typical CMOS I/O buffers include at least one PMOS "pull-up" transistor and at least one NMOS "pull-down" transistor. The source of the PMOS transistor is connected to a logic high voltage ($V_{DD}$), while the drain of the PMOS transistor is connected to the output and/or input voltage. The drain of the NMOS transistor is also connected to the input/output voltage and thus to the drain of the PMOS transistor. The source of the NMOS transistor is tied to a logic low voltage ($V_{SS}$).

If the buffer is used for output, the gates of the PMOS and NMOS transistors are tied to internal transistors to implement a conventional pull-up/pull-down configuration. If the buffer is used for input only, the gate of the NMOS transistor is conventionally connected to the logic low voltage, while the gate of the PMOS transistor is connected to the logic high voltage. With their gates tied to fixed voltages, these input-only transistors do not serve the conventional pull-up/pull-down function actively. Herein, the PMOS and NMOS transistors of an input buffer are considered "inactive" pull-up and pull-down transistors, respectively.

Because ESD damage is associated with excessive current, more robust I/O buffers include several PMOS/NMOS pairs in parallel to divide ESD-induced currents. This design is referred to as "multi-finger", each of the transistor pairs constituting a "finger".

When a sufficiently great positive "first-breakdown" voltage ($V_{t1}$) is applied to the drain of an NMOS pull-down transistor, an avalanche source/drain current is induced. The voltage drops to a snap-back voltage ($V_{SB}$) as this current is established. At this point, the transistor functions as a NPN bipolar transistor, with current increasing with voltage. A further voltage increase to a second breakdown voltage ($V_{t2}$), results in a further current surge and a concomitant voltage drop. This second voltage drop is associated with destruction of the transistor. The objective of ESD protection is to prevent transistors from suffering this second breakdown.

Due to processing non-uniformities, $V_{t1}$ can vary among the different NMOS transistors of a multi-finger I/O buffer. During an ESD event, the voltage reduction after the first NMOS transistor enters its bipolar mode temporarily prevents other transistors from reaching their slightly higher $V_{t1}$s and thus from entering their bipolar modes. Thus, the first transistor must bear the entire current load.

If the first transistor reaches the second breakdown voltage $V_{t2}$ before the other transistors enter their bipolar modes, the first transistor will be destroyed. The destruction can then cascade to other transistors. If other transistors enter bipolar mode before the first transistor reaches $V_{t2}$, the resulting voltage drops and current divisions serve to protect all the transistors. Accordingly, it is desirable that all $V_{t1}$s be lower than all $V_{t2}$s for an I/O buffer. In other words, the nominal difference between $V_{t2}$, and $V_{t1}$ should be greater than the variations in $V_{t1}$ and $V_{t2}$ due to processing non-uniformities.

In the event of a negative-going ESD event, the drain/substrate junction is forward biased. The resulting current relaxes the charge buildup due to the ESD event. Thus, positive-going ESD events, during which the drain/substrate is reverse biased, are a greater concern than negative-going ESD events.

In theory, the PMOS pull-up transistors should act in a fashion complementary to the action of the NMOS pull-down transistors. It should counter charge build up during positive ESD events since its drain/substrate junction is forward biased. During negative ESD events, it should be subject to the two breakdown transitions at $V_{t1}$ and $V_{t2}$. However, in the response to the ESD event, the NMOS transistor dominates. This is due, in part, to the fact that the PMOS transistors are formed within an n-well within a p-type substrate. This renders them less efficient in their response to ESD events. Accordingly, the primary concern is the response of the NMOS transistors to positive ESD events. (In the atypical case where PMOS pull-up transistors act more efficiently than the NMOS pull-down transistors, negative ESD events are the primary concern.)

It has been observed empirically that input-only buffers are more subject to ESD destruction than are output buffers and input/output buffers. Thus, input buffers have become the weak link of ESD resistance. In accordance with this discovery, some input buffers connect each included NMOS gate to the drain of another NMOS transistor that has its gate and source tied to the logic low voltage. This arrangement has improved ESD protection.

The physical explanation for the success of this approach appears to be that the extra transistor lowers the voltage ($V_{t1}$) at which the NMOS pull-down transistor transitions to bipolar operation relative to the voltage ($V_{t2}$) at which the NMOS transistor in bipolar operation reaches second breakdown, and thus destruction. By lowering the voltage at which the transition to bipolar operation occurs relative to the voltage at which the transition to second breakdown occurs, one ensures that the other NMOS transistors will reach bipolar operation and share the ESD current before any of the transistors enter second breakdown.

The added transistors coupling the NMOS pull-down transistor gates to ground places the ESD protection afforded to input buffers on a par with that afforded to output-capable transistors. These additional transistors cost additional silicon real estate, which is particularly expensive in gate-array applications. What is needed is a more economical gate-array input buffer with enhanced ESD.

SUMMARY OF THE INVENTION

The present invention provides a multi-finger input buffer in which the gates of at least some included transistors are floating and are capacitively coupled to a suitable fixed logic voltage through a metal layer. In the context of current practices, it is the gates of the NMOS transistors that are capacitively coupled to a logic low voltage ($V_{SS}$). However, alternatively, or in addition, the gates of PMOS transistors can be capacitively coupled to a logic high voltage ($V_{DD}$).

In the context of a gate array, no contact openings are made over the floating gates. Dielectric is left over the floating gates, while other transistor elements are exposed in accordance with a contact mask pattern. The succeeding metal layer is patterned so that a metal lead to ground is capacitively coupled to the floating gates. The discussion below assumes that the NMOS gates are capacitively coupled, but it should be understood that the same technique can be applied to the PMOS transistors.

The NMOS transistors serve as (inactive) pull-down devices and cooperate with respective (inactive) pull-up devices to provide the ESD protection function. The pull-up devices can be conventionally configured PMOS transistors, i.e., the source and gate can be shorted to a logic high voltage, while the drain is coupled to the input voltage and to the drain of the respective NMOS transistor. Alternatively, the PMOS transistors can mirror the NMOS transistors, having floating gates capacitively coupled to the logic high voltage ($V_{DD}$). In a configuration suitable for purely NMOS technology, the pull-up device can be a resistor between the logic high voltage and the input voltage.

Capacitively coupling the floating gate to $V_{SS}$ puts the gate at the intermediate voltage of a voltage divider defined by the capacitance between the gate and the metal and the capacitance between the gate and the drain. The voltage at which the transition to bipolar operation is made is a function of the ratio of these two capacitances. This ratio can be selected as a function of the dielectric thickness between the gate and the metal conductor. The voltage at which the transition to bipolar operation can thus be set sufficiently below the voltage at which the transition to second breakdown occurs so that all NMOS transistors of an input buffer start conducting current before any of them reaches second breakdown. This is the condition that minimizes ESD damage.

A major advantage of the present invention is that it provides the desired ESD protection for input buffers without requiring additional transistors or processing steps. The difference in processing is that one omits contact holes that would have been made in prior art that directly connected the pull-down gates to $V_{SS}$ or to other transistors. This approach to ESD protection is completely compatible with prevalent gate array design since it only requires modification of the contact and the first metal masks of existing designs. These and other features and advantages of the present invention are apparent from the description below with reference to the following drawings.

DESCRIPTION OF THE PREFERRED EMBODIMENTS

A CMOS input buffer 10 in accordance with the present invention comprises complementary pairs 11–14 of PMOS pull-up transistors P1–P4 and NMOS pull-down transistors N1–N4. The PMOS sources SP1–SP4 and the PMOS gates GP1–GP4 are tied to logic high voltage $V_{DD}$. The PMOS drains DP1–DP4 are tied to a variable input voltage $V_{IN}$, which is received at a pin PIN. The NMOS drains DN1–DN4 are connected to the respective PMOS drains and to $V_{IN}$. The NMOS sources SN1–SN4 are connected to a logic low voltage $V_{SS}$. The NMOS gates GN1–GN4 are capacitively coupled to metal conductors MN1–MN4, which are shorted to $V_{SS}$. As indicated, NMOS gates GN1–GN4 are floating.

Figure 2:
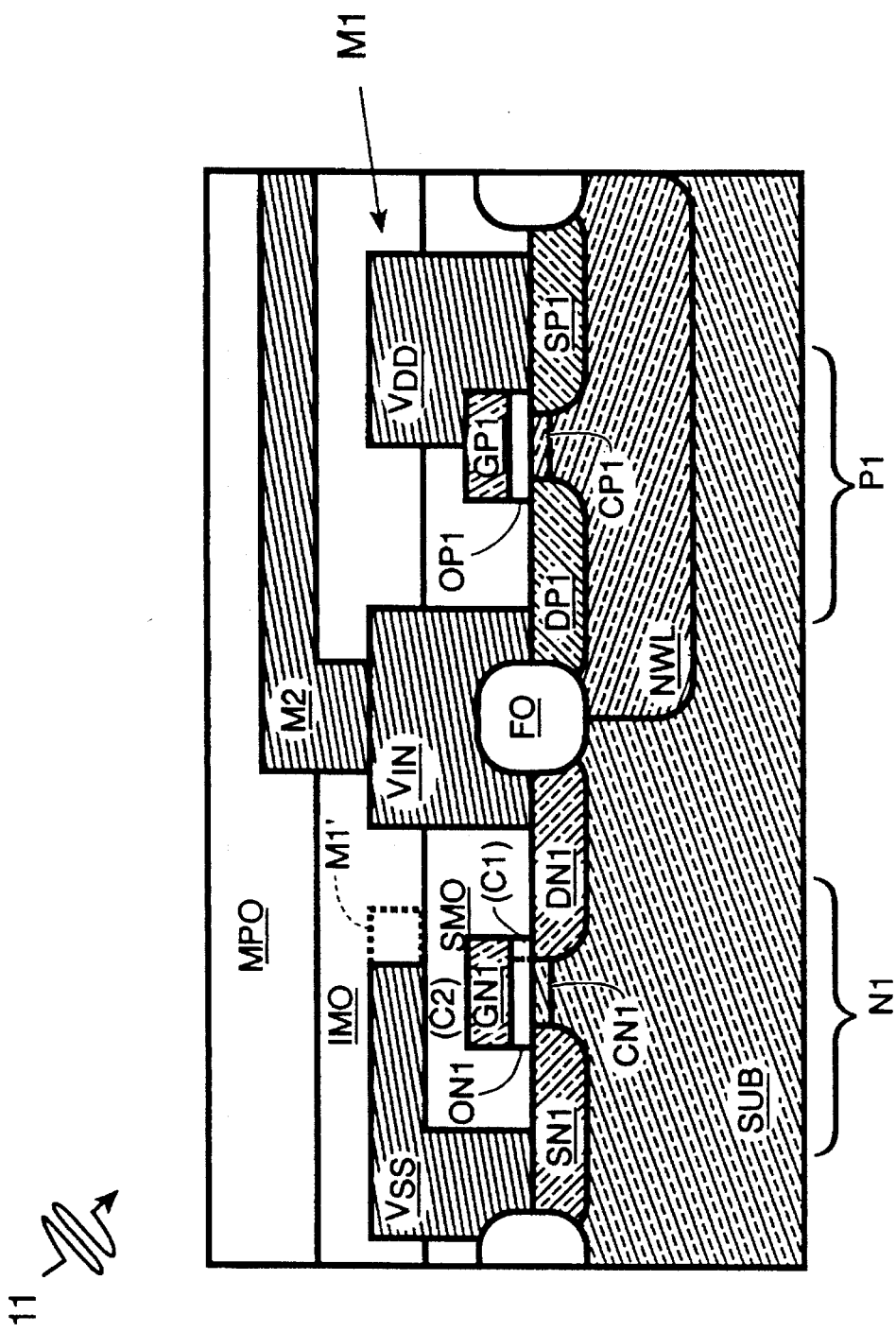
FIG. 2 is a schematic sectional view of a CMOS transistor pair for the input buffer of FIG. 1. In this figure, the sign of the slope of the hatching for silicon and polysilicon indicates conductivity type, while slope roughly indicates dopant concentration.

The structure of complementary pair 11 is schematically represented in FIG. 2. Fabricated in a lightly doped p-type substrate SUB are the active regions of transistors N1 and P1. The active regions of transistor N1 are heavily doped n-type NMOS source SN1, lightly doped NMOS channel CN1, and heavily doped n-type NMOS drain DN1. In addition, transistor N1 includes heavily doped n-type polysilicon gate GN1, which is capacitively coupled to $V_{IN}$ through the gate oxide ON1, where the gate overlaps (as indicated by C1 in FIG. 2) drain DN1.

Transistor P1 is formed in a lightly-doped n-type n-well NWL. The active substrate regions of transistor P1 are heavily doped p-type drain DP1, lightly doped PMOS channel CP1, and heavily doped p-type source SP1. In addition, transistor PN1 includes heavily doped n-type polysilicon gate GP1, insulated from channel CP1 by gate oxide OP1. Substrate SUB, n-well NWL, the components of transistors N1 and P1, a field oxide FO, and submetal oxide SMO (without apertures) constitute an I/O buffer portion of a gate array blank.

Post blank processing begins with the formation of apertures in submetal dielectric SMO to allow electrical access to transistors N1 and P1. Apertures expose NMOS source SN1, NMOS drain DN1, PMOS drain DP1, PMOS source DP1, and PMOS gate GP1. However, NMOS gate GN1 is not exposed. A first metal deposition and patterning forms a first metal pattern M1, providing conductors for $V_{SS}$, $V_{IN}$, and $V_{DD}$. This pattern is passivated by intermetal oxide IMO. Apertures are then formed in intermetal oxide IMO. These apertures define intermetal vias when the second layer of metalization M2 is deposited. The second metal is patterned to define a second level of metal conductors. The resulting structure is passivated by metal passivation oxide MPO, completing the integrated circuit.

Figure 1:
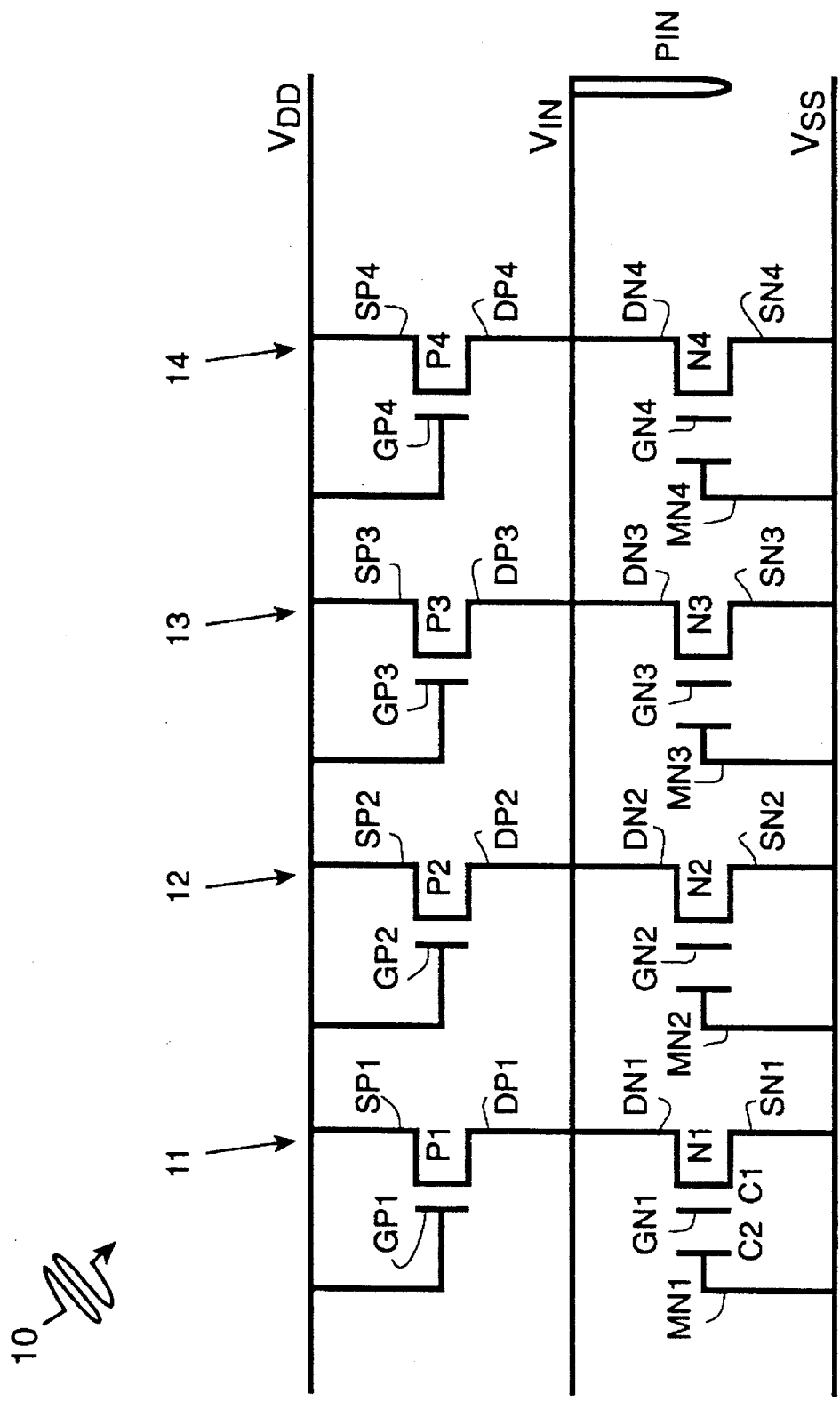
FIG. 1 is a circuit diagram of an input buffer for a CMOS gate array integrated circuit in accordance with the present invention.

The completed integrated circuit is then suitably packaged, during which packaging pin PIN (FIG. 1) is connected to $V_{IN}$. Capacitance C2 is indicated in FIG. 2, whereas capacitance C1 is across the drain-overlap portion of gate oxide ON1. Capacitance C2 is selected so that a gate voltage of about 1–2 volts is established in the event of a 8–12 volt drain voltage $V_{IN}$ during an ESD event. Accordingly, C2/C1 should be roughly 1/10, or more specifically, between 1/20 and 1/5.

Buffer 10 and the incorporating integrated circuit are fabricated with a nominal 500 nm (0.5 micron) feature size. Diffusion of the source/drain dopant yields a gate/drain overlap of about 100 nm, with a gate oxide thickness of 10 nm. The M1 VSS overlap with gate GN1 is 400 nm; submetal dielectric SMO is 400 nm thick over gate GN1. This results in a capacitance ratio C2/C1 of 1/10.

For a thicker submetal oxide, greater overlap is required to achieve the same capacitance C2. An alternative first metal pattern M1' is indicated in ghost in FIG. 2. This metal pattern implements a complete overlap of gate GN1, plus a tolerance for mask misalignment. Further control of C2 can be had by adjusting the overlap of metal and gate GN1 in the direction perpendicular to the plane of FIG. 2.

Given that ESD protection can be enhanced with values with −50% and +100% of the above values, there is ample latitude for controlling C2 by the overlap of metal M1 with gate GN1. However, where the submetal oxide approaches 1000 nm and greater, even full overlap may fall short of the desired C2. In this case, a gradient contact mask can be used to thin the dielectric over the floating gates during the contact etch to provide for greater metal-to-gate capacitances.

Figure 3:
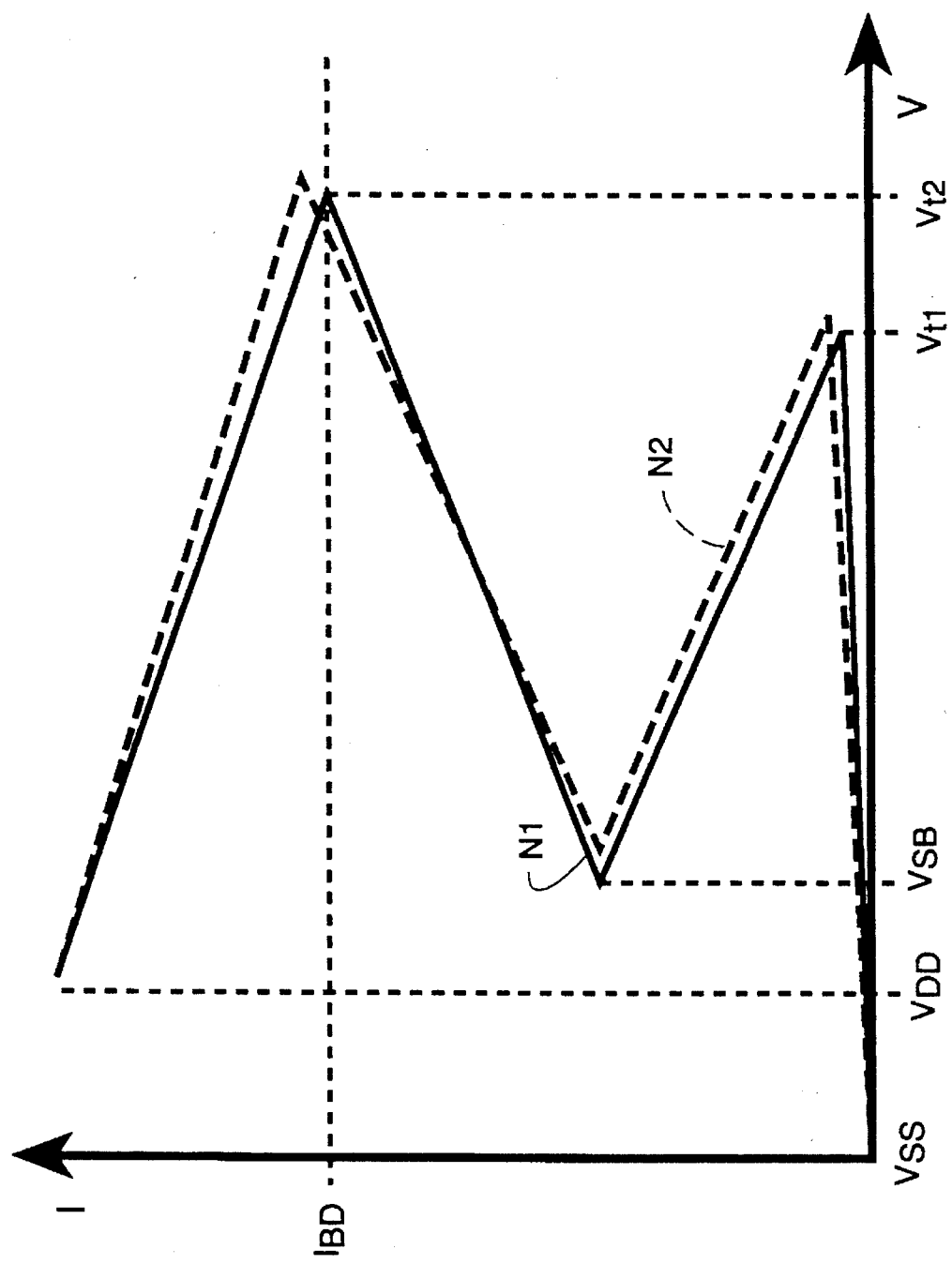
FIG. 3 is a graph of current versus voltage for two NMOS transistors of the buffer of FIG. 1.

The current-versus-voltage (I/V) characteristics of NMOS transistor N1 are represented in FIG. 3. The gate array NMOS transistors are designed to work with drain voltages between $V_{SS}$ and $V_{DD}$. Within this voltage range, there is no significant drain current. As the drain voltage approaches $V_{t1}$, during abnormal conditions, a avalanche drain current is generated. At $V_{t1}$, the voltage is great enough to generate a source-to-drain current in an NPN bipolar mode of operation. Upon initiation of the bipolar mode, the voltage falls to snap-back voltage $V_{SB}$. Further increases in voltage cause the indicated current ramp, until at $V_{t2}$, second breakdown is induced. The second breakdown results in permanent damage to the transistor. The object of ESD protection is to avoid this second breakdown.

FIG. 3 also represents the characteristics of NMOS transistor N2, which has the same nominal electrical characteristics as transistor N1. Due to processing non-uniformities, in practice small differences in electrical characteristics are expected. Since the voltage drops to snap-back voltage $V_{SB}$ when $V_{t1}$ is reached and transistor N1 goes into bipolar mode, transistor N2 does not enter bipolar mode when transistor N1 does. Thus, N2 does not share the current burden with N1. However, after N1 goes into bipolar mode and before $V_{t2}$ and the corresponding $I_{t2}$ are reached, transistor N2 goes into bipolar mode, sharing the current, countering the voltage rise to $V_{t2}$. Transistors N3 and N4 can also share current in this manner. Thus, second breakdown is best averted when the lowest $V_{t2}$ is above the highest $V_{t1}$ for the transistors of an input buffer. The present invention establishes this condition through selection of a proper gate-metal capacitance. For buffer 10, $V_{SS}$ is 0 V, $V_{DD}$ is 3.3 V, $V_{IN}$ varies between 0 and 3.3 volts, $V_{SB}$ is about 6 volts, $V_{t1}$ is about 10 volts, and $V_{t2}$ is about 12 volts.

Figure 4:
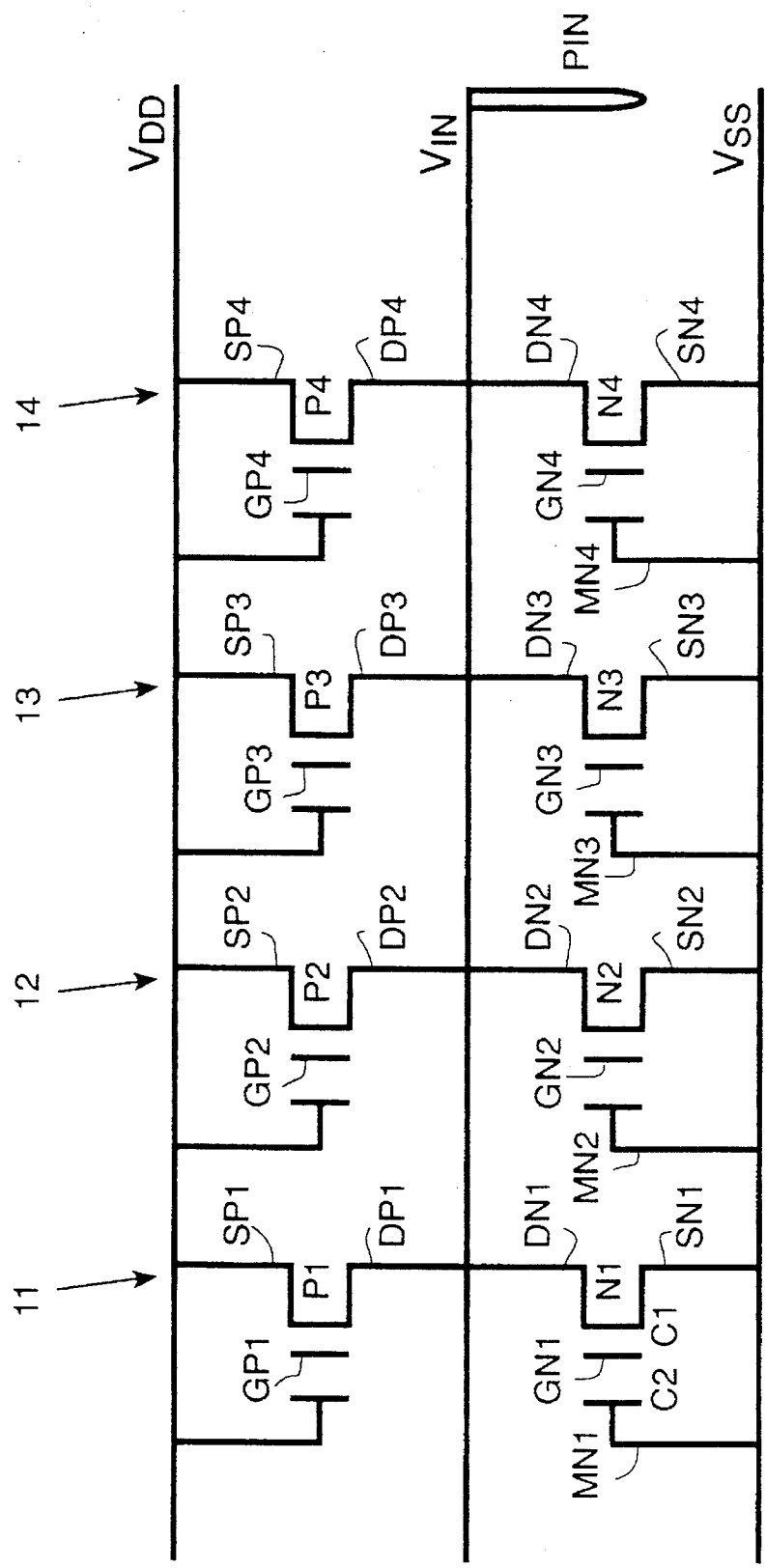
FIG. 4 is a circuit diagram of a second input buffer in accordance with the present invention.

Clearly, the invention can be modified to adjust $V_{t1}$ relative to $V_{t2}$ and to protect against different target ESD voltages. The invention can be scaled to different device geometries by changing metal/gate separation and overlap. As shown in FIG. 4, the PMOS transistor can have its gate floating and capacitively coupled to a logic high voltage; in this arrangement the PMOS transistor mirrors the NMOS transistor. Furthermore, an NMOS structure can be realized by using resistors for the pull-up devices instead of PMOS transistors. The invention also provides PMOS transistors capacitively coupled to a logic high voltage, while the NMOS transistors are not; this is appropriate, for example, when the substrate is n-type and the NMOS transistors are formed in p-wells. These and other modifications to and variations upon the preferred embodiments are provided for by the present invention, the scope of which is limited only by the following claims.

What is claimed is:

1. A multi-finger input buffer for an integrated circuit comprising parallel buffer elements, each buffer element including:
a pull-up device having a first node coupled to a logic high voltage and a second node coupled to an input voltage; and
an NMOS pull-down transistor, the source of which is coupled to a logic low voltage, the drain of which is coupled to said input voltage, the gate of which is floating and capacitively coupled to a metal structure coupled to said logic low voltage;

each said NMOS pull-down transistor having a respective first breakdown voltage and a respective second breakdown voltage so that said buffer elements are collectively characterized by a range of first breakdown voltages having a maximum first breakdown voltage, and by a range of second breakdown voltages having a minimum second breakdown voltage greater than said maximum first breakdown voltage.

2. A multi-finger input buffer as recited in claim 1 wherein each said NMOS has a respective gate-to-metal capacitance C2 and a respective gate-to-drain capacitance C1, where C2/C1 is greater than 1/20.

3. A multi-finger input buffer as recited in claim 1 wherein each said NMOS has a respective gate-to-metal capacitance C2 and a respective gate-to-drain capacitance C1, where C2 and C1 are selected so that the respective gate voltage is between 1–2 volts when the respective drain voltage is between 8–12 volts.

* * * * *